(12) United States Patent
Kojima

(10) Patent No.: US 8,704,527 B2
(45) Date of Patent: Apr. 22, 2014

(54) COMPARISON JUDGMENT CIRCUIT

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 670 days.

(21) Appl. No.: 12/745,889

(22) PCT Filed: Jun. 2, 2009

(86) PCT No.: PCT/JP2009/002473
§ 371 (c)(1),
(2), (4) Date: Jun. 2, 2010

(87) PCT Pub. No.: WO2010/140190
PCT Pub. Date: Dec. 9, 2010

(65) Prior Publication Data
US 2011/0121904 A1   May 26, 2011

(51) Int. Cl.
  G01R 1/36    (2006.01)
  G01R 19/165  (2006.01)
  G01R 31/36   (2006.01)

(52) U.S. Cl.
  CPC ............ *G01R 1/36* (2013.01); *G01R 19/16566* (2013.01); *G01R 31/3606* (2013.01)
  USPC ........................................................ 324/522

(58) Field of Classification Search
  None
  See application file for complete search history.

(56) References Cited

U.S. PATENT DOCUMENTS

| | | | | |
|---|---|---|---|---|
| 5,440,441 | A * | 8/1995 | Ahuja | 361/62 |
| 6,232,815 | B1 | 5/2001 | Turvey | 327/291 |
| 2003/0057990 | A1 * | 3/2003 | West | 324/765 |
| 2006/0273811 | A1 * | 12/2006 | Haigh et al. | 324/761 |

FOREIGN PATENT DOCUMENTS

| | | |
|---|---|---|
| JP | 4-251517 | 9/1992 |
| JP | 4-251517 A | 9/1992 |
| JP | 5-312899 | 11/1993 |
| JP | 5-312899 A | 11/1993 |
| JP | 8-327705 | 12/1996 |
| JP | 8-327705 A | 12/1996 |
| JP | H10-10200 A | 1/1998 |
| JP | 10-240560 | 9/1998 |
| JP | 10-240560 A | 9/1998 |
| JP | H10-232266 A | 9/1998 |
| JP | H11-237438 A | 8/1999 |
| JP | 2006-194644 A | 7/2006 |
| JP | 2006-194664 | 7/2006 |

OTHER PUBLICATIONS

PCT International Search Report for PCT Application No. PCT/JP2009/002473 mailed on Sep. 8, 2009.
PCT Written Opinion for PCT Application No. PCT/JP2009/002473 mailed on Sep. 8, 2009.
IPRP for corresponding PCT/JP2009/002473 issued on Dec. 12, 2011.
WO for corresponding PCT/JP2009/002473 mailed on Sep. 8, 2009, along with its English translation.
Office action for related Japanese patent application No. 2010-513529 issued on May 21, 2013 and an English translation.

* cited by examiner

*Primary Examiner* — Paresh Patel
(74) *Attorney, Agent, or Firm* — Ladas & Parry, LLP

(57) ABSTRACT

A comparison judgment circuit judges the level of a signal received, via a transmission line, from a second device which is a communication partner. An input/output terminal is connected to the transmission line. An attenuator circuit attenuates the voltage at the input/output terminal so as to generate an attenuated voltage. A level comparator compares the attenuated voltage with a predetermined threshold voltage, and generates a level judgment signal that corresponds to the comparison result. A protection circuit monitors the voltage at the input/output terminal or the attenuated voltage. When the voltage to be monitored deviates from a predetermined voltage range, the protection circuit forcibly cuts off or changes the voltage input to the level comparator.

9 Claims, 10 Drawing Sheets

COMPARISON JUDGMENT CIRCUIT

BACKGROUND OF THE INVENTION

This application is the U.S. National Stage of International Patent Application No. PCT/JP2009/002473 filed on Jun. 2, 2009, and claims priority thereto, the disclosure of which is hereby incorporated by reference in its entirety.

FIELD OF THE INVENTION

The present invention relates to a comparison judgment circuit configured to judge the level of a signal to be transmitted via a transmission line.

DESCRIPTION OF THE RELATED ART

In a case in which data is transmitted and received between two semiconductor devices, in some cases, bidirectional transmission is performed via a single transmission line. In a case in which a device including such a bidirectional interface is tested, the amplitude of the signal output from a device under test (DUT) is compared with a threshold voltage so as to judge the quality of the DUT.

Description will be made regarding a test apparatus which tests a DUT having a bidirectional interface. The test apparatus includes a transmitter (driver) and a receiver (comparison judgment circuit) connected to a common transmission line. The driver transmits a test pattern to the DUT. The comparison judgment circuit judges the logical value of a signal output from the DUT, or checks the amplitude of the signal.

FIG. 1 is a block diagram which shows a test system 500 employing a typical driver/comparator circuit 400. The driver/comparator circuit 400 includes a driver amplifier DRV1 and a level comparator CMP1.

The driver/comparator circuit 400 is mounted on the test apparatus, and is connected to a communication partner device, i.e., a DUT 102, via a transmission line 104. The driver amplifier DRV1 outputs a signal Vd to the DUT 102. The level comparator CMP1 compares the amplitude level of a signal Va received via the transmission line 104 with a threshold level VOH, and generates a signal SH which indicates the comparison result.

RELATED ART DOCUMENTS

Patent Documents

[Patent Document 1]
    Japanese Patent Application Laid Open No. H10-10200
[Patent Document 2]
    Japanese Patent Application Laid Open No. H10-232266
[Patent Document 3]
    Japanese Patent Application Laid Open No. H11-237438
[Patent Document 4]
    U.S. Pat. No. 6,232,815 Specification In some cases, the DUT 102 outputs a signal Vu having a relatively large amplitude. In this case, the level comparator CMP1 must be configured employing a transistor element having a breakdown voltage that is sufficiently high to withstand such a large amplitude. However, in general, there is a problem in that the operation speed of such a high-voltage transistor is low. That is to say, conventional systems designed assuming that a signal Vu having such a large amplitude is output from the DUT 102 have a problem of a restricted test rate.

Such a problem is not restricted to a test apparatus. Also, such a problem can occur in the same way in signal transmission between semiconductor devices.

SUMMARY OF THE INVENTION

The present invention has been made in view of such a situation. Accordingly, it is an exemplary purpose of the present invention to provide a comparison judgment circuit which is capable of evaluate a high-speed signal.

An embodiment of the present invention relates to a comparison judgment circuit configured to judge the level of a signal received from a communication partner device via a transmission line. The comparison judgment circuit comprises: an input/output terminal connected to the transmission line; a first resistor arranged such that a first terminal thereof is connected to the input/output terminal; a second resistor arranged such that a first terminal thereof is connected to a second terminal of the first resistor, and such that a first voltage is applied to a second terminal thereof; an attenuator circuit configured to output an attenuated voltage that occurs at a connection node that connects the first resistor and the second resistor; and a level comparator configured to compare the attenuated voltage with a predetermined threshold voltage, and to generate a level judgment signal that corresponds to the comparison result.

With such an embodiment, the voltage level to be input to the level comparator can be maintained at a low level. Thus, such an arrangement can employ a high-speed comparator configured using low breakdown voltage components.

It should be noted that any combination of the aforementioned components may be made, and any component of the present invention or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
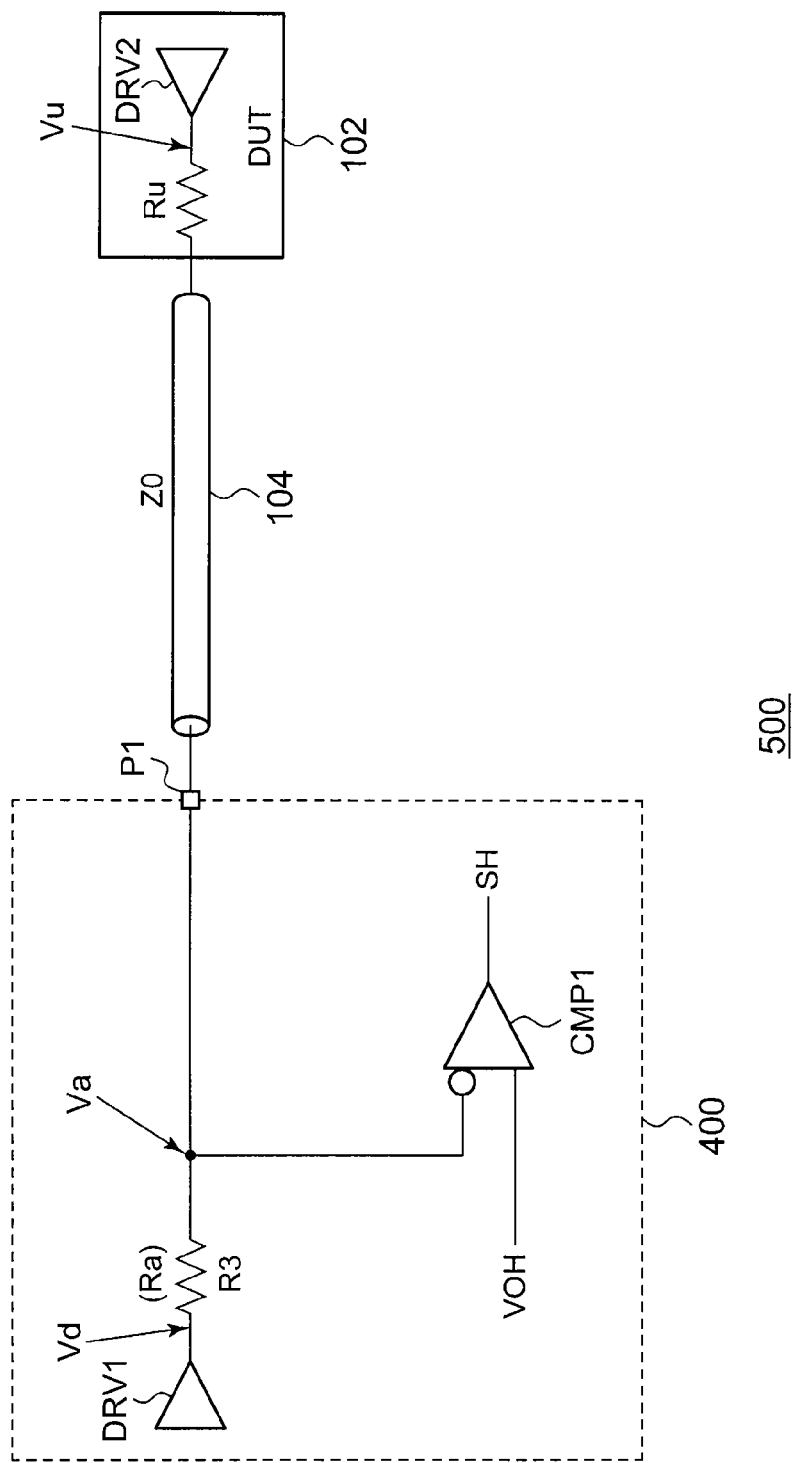
FIG. 1 is a block diagram which shows a test system employing a typical driver/comparator circuit.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C, via another member that does not affect the electric connection therebetween, in addition to a state in which the member A is directly connected to the member C, or the member B is directly connected to the member C.

Figure 2:
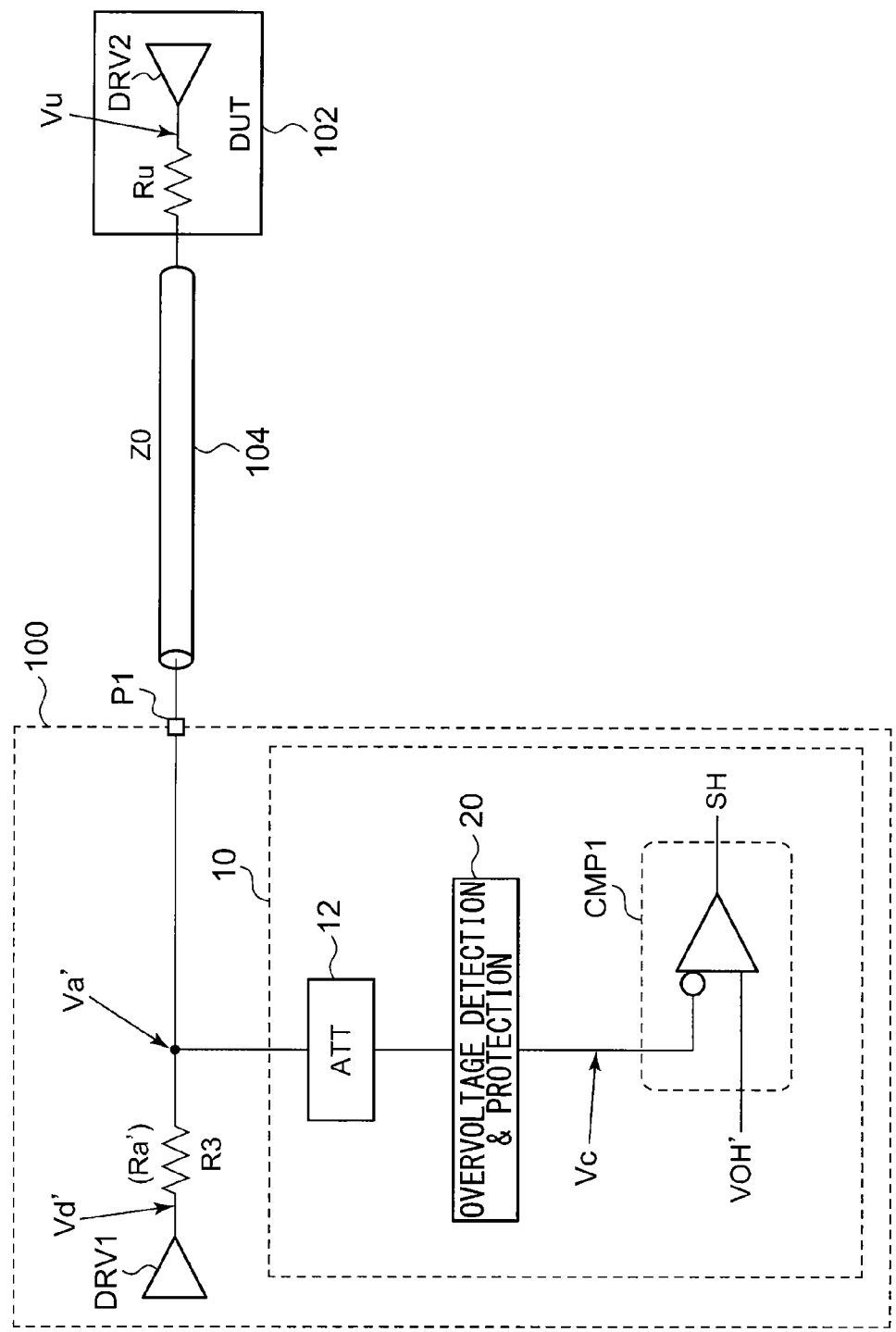
FIG. 2 is a block diagram which shows a configuration of a driver/comparator circuit according to an embodiment.

An embodiment described below relates to a driver/comparator circuit having a bidirectional interface. FIG. 2 is a block diagram which shows a configuration of a driver/comparator circuit 100 according to an embodiment.

The driver/comparator circuit 100 is an interface circuit for a first device. The driver/comparator circuit 100 is connected to a communication partner device (which will be referred to as the "second device" hereafter) 102 via a transmission line 104, and outputs a signal Vd' to the second device 102, or receives a signal Vu output from the second device 102.

Also, the driver/comparator circuit 100 is suitably employed as an interface circuit for automatic test equipment ATE (Automatic Test Equipment) (which is also referred to as "pin electronics"). That is to say, the driver/comparator circuit 100 outputs pattern data to the second device (DUT). At the same time, the driver/comparator circuit 100 receives a signal from the DUT, and judges the amplitude (level) of the signal thus received. Such a case of a test system is shown in FIG. 2.

The second device 102 includes a driver amplifier DRV2 and an output resistor Ru. The signal Vu output from the driver amplifier DRV2 is input to an input/output terminal P1 of the driver/comparator circuit 100 via the transmission line 104. The output resistor Ru is provided to the driver amplifier DRV2. Description will be made below under the assumption that impedance matching is achieved between the characteristic impedance Z0 of the transmission line 104 and the output resistor Ru included in the second device 102.

The driver/comparator circuit 100 includes the input/output terminal P1 via which the transmission line 104 is connected. The driver/comparator circuit 100 includes a comparison judgment circuit 10, a driver amplifier DRV1, and a third resistor R3.

The driver amplifier DRV1 generates a signal Vd' which is to be transmitted to the second device 102. Also, the signal Vd' may be transmitted in the form of a binary signal which may be either high or low, or may be transmitted in the form of a multi-valued signal such as a four-valued signal or an eight-valued signal. The third resistor R3 is provided between the output terminal of the driver amplifier DRV1 and the input/output terminal P1. In a case in which the first device transmits no signal to the second device 102, i.e., in a case in which simplex transmission is performed, the driver amplifier DRV1 may generate a constant voltage.

The comparison judgment circuit 10 judges the amplitude level of the voltage Va' that occurs at the input/output terminal P1. The comparison judgment circuit 10 includes an attenuator circuit 12, a protection circuit 20, and a level comparator CMP1.

The attenuator circuit 12 attenuates the voltage Va' at the input/output terminal P1 so as to generate an attenuated voltage Vc. The level comparator CMP1 compares the attenuated voltage Vc thus generated with a predetermined upper threshold voltage VOH', and generates a level judgment signal SH that corresponds to the comparison result. The comparison judgment circuit 10 may further includes a comparator (not shown) arranged in parallel with the level comparator CMP1, and configured to compare the attenuated voltage Vc with a predetermined lower threshold voltage VOL'.

The attenuated voltage Vc is supplied to the level comparator CMP1 via the protection circuit 20. Where there is an overvoltage state in which the attenuated voltage Vc (or the voltage Va' at the input/output terminal P1) is higher than the predetermined upper threshold voltage (or where there is a low voltage state in which the attenuated voltage Vc is lower than the predetermined lower threshold voltage), the protection circuit 20 forcibly cuts off the attenuated voltage Vc to be supplied to the level comparator CMP1, or changes the voltage value thereof.

The above is the configuration of the driver/comparator circuit 100. Next, description will be made regarding the operation thereof. In the driver/comparator circuit 100 shown in FIG. 2, the voltage Va' at the input/output terminal P1 is attenuated by the attenuator circuit 12. Thus, the signal Vc having a small amplitude is input to the level comparator CMP1 even in a case in which the second device 102 generates the voltage Vu having a large amplitude.

With the driver/comparator circuit 100 shown in FIG. 2, the level comparator CMP1 can be configured using a low breakdown voltage device, thereby providing high-speed comparison processing. That is to say, such an arrangement is capable of appropriately evaluating the voltage level of a high-speed signal.

Furthermore, it can be assumed that where the attenuated voltage Vc exceeds the breakdown voltage of the level comparator CMP1, it is due to unexpected error or noise. In such an abnormal state, the protection circuit 20 protects the level comparator CMP1 from such an overvoltage state.

With conventional techniques, there is a need to design the breakdown voltage of the level comparator CMP1 giving consideration not only to the output voltage of the second device 102 in the normal state, but also to abnormal states such as short-circuits to the power supply or the ground, surge noise, etc. In contrast, with the driver/comparator circuit 100 according to the embodiment, by providing the protection circuit 20, the level comparator CMP1 is not exposed to an overvoltage state in such an abnormal state, thereby enabling the design of a lower breakdown voltage of the level comparator CMP1. Together with the attenuator circuit 12 thus provided, this improves performance of the high-speed operation of the driver/comparator circuit 100.

Figure 3:
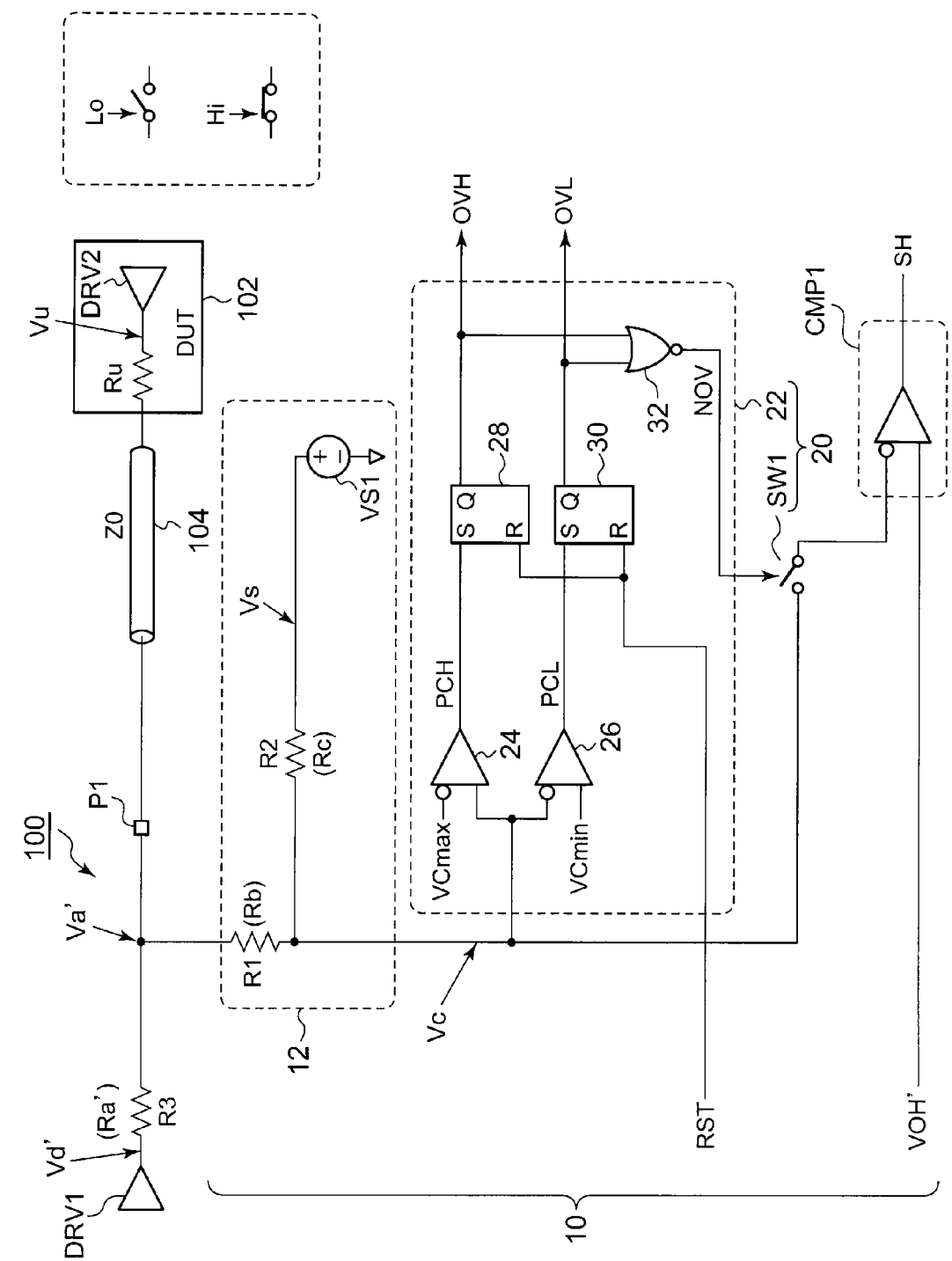
FIG. 3 is a circuit diagram which shows a first specific example configuration of a comparison judgment circuit shown in FIG. 2.

FIG. 3 is a circuit diagram which shows a specific first example configuration of the comparison judgment circuit 10 shown in FIG. 2.

The attenuator circuit 12 includes a first resistor R1, a second resistor R2, and a first voltage source VS1. A first terminal of the first resistor R1 is connected to the input/ output terminal P1. A first terminal of the second resistor R2 is connected to a second terminal of the first resistor R1. A first voltage Vs is applied to a second terminal of the second resistor R2. The first voltage Vs is generated by the first voltage source VS1. The attenuator circuit 12 outputs, as the attenuated voltage Vc, the electric potential at a connection node that connects the first resistor R1 and the second resistor R2. The resistance value of the first resistor R1 will be represented by Rb, and the resistance value of the second resistor R2 will be represented by Rc. The resistance values of the first resistor R1 and the second resistor R2 can be determined as desired.

The following relation between the voltage Va' at the input/output terminal P1 and the attenuated voltage Vc holds true.

$$Vc = (Rc \cdot Va' + Rb \cdot Vs)/(Rb+Rc)$$

That is to say, the attenuator circuit 12 attenuates the amplitude, i.e., the change in the voltage Va' at the input/output terminal P1, with an attenuation factor of Rc/(Rb+Rc). Furthermore, the attenuator circuit 12 applies a level shift that corresponds to the first voltage Vs. In a case in which the first voltage Vs is the ground voltage (0 V), the shift amount is zero. Description will be made later regarding the effects of the level shift operation.

The protection circuit 20 shown in FIG. 3 includes a voltage monitoring circuit 22 and a protection switch SW1. The voltage monitoring circuit 22 generates a protection signal NOV which is asserted (set to the low level) when the attenuated voltage Vc deviates from a predetermined voltage range (VCmin to VCmax).

The voltage monitoring circuit 22 includes an upper-limit comparator 24, a lower-limit comparator 26, a first flip-flop 28, a second flip-flop 30, and a NOR gate 32.

The upper-limit comparator 24 compares the attenuated voltage Vc with a maximum voltage VCmax, and generates a first detection signal PCH which indicates the comparison result. The lower-limit comparator 26 compares the attenuated voltage Vc with a minimum voltage VCmin, and generates a second detection signal PCL which indicates the comparison result. The maximum voltage VCmax is set to the maximum voltage value at which the level comparator CMP1 that receives such a voltage as an input signal can operate without any difficulty (without causing any stress). Also, the minimum voltage VCmin is set to the minimum voltage value at which the level comparator CMP1 that receives such a voltage as an input can operate without any difficulty.

When Vc>VCmax, the first detection signal PCH is set to the high level. When Vc<VCmin, the second detection signal PCL is set to the high level. That is to say, when the attenuated voltage Vc deviates from the voltage range VCmin to VCmax, one of the signals PCH or PCL is set to the high level.

The signals PCH and PCL are input to the set terminals (S) of the first flip-flop 28 and the second flip-flop 30, respectively. Each of the flip-flops 28 and 30 receives a reset signal from an external circuit via the reset terminal (R) thereof. The NOR gate 32 generates the logical NOR of the output signals of the first flip-flop 28 and the second flip-flop 30. That is to say, when the attenuated voltage Vc is within the input voltage range defined by the level comparator CMP1, the protection signal NOV generated by the NOR gate 32 is high level (negated). When the attenuated voltage Vc deviates from the input voltage range, the protection signal NOV is low level (asserted).

The protection switch SW1 is provided on a path from the attenuator circuit 12 to the level comparator CMP1. When a high-level signal is input, i.e., when the protection signal NOV is negated, the protection switch SW1 is set to the conducting state, and when a low-level signal is input, i.e., when the production signal NOV is asserted, the protection switch SW1 is set to the cutoff state.

Next, description will be made regarding the design method for the voltages and the resistance values employed in the driver/comparator circuit 100. The design approach is to make the characteristics of the driver/comparator circuit 100 shown in FIG. 3 match the characteristics of the typical driver/comparator circuit 400 shown in FIG. 1. In other words, the design approach is to provide functions equivalent to those of the typical driver/comparator circuit 400, which does not include the attenuator circuit 12, to the driver/comparator circuit 100 including the attenuator circuit 12.

The output voltage Vd' (Vd) of the driver amplifier DRV1 can exhibit various electric potential values such as a high-level value (VIH), low-level value (VIL), a terminal electric potential value (VT), or the like, depending on the data to be transmitted to the second device 102. However, to facilitate understanding, description will be made regarding a simple arrangement in which the output voltage Vd' (Vd) is set to a fixed electric potential.

Figure 4:
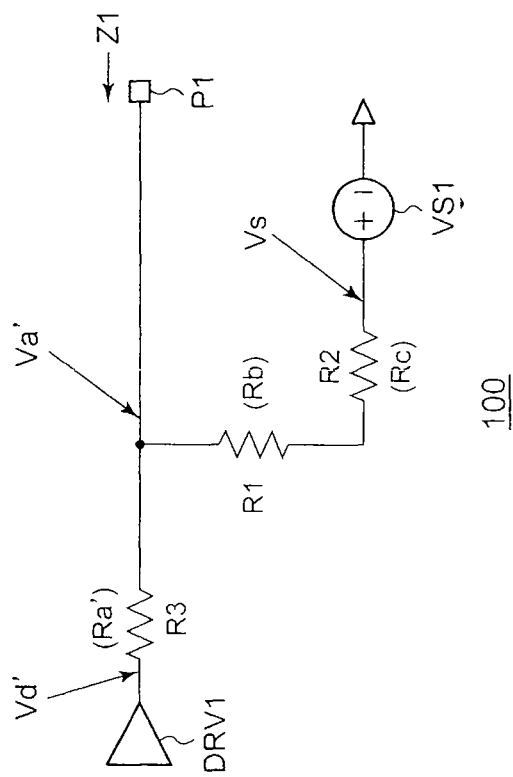
FIGS. 4A and 4B are circuit diagrams showing a driver/comparator circuit shown in FIG. 1 and a driver/comparator circuit shown in FIG. 3, respectively.
Figure 4:
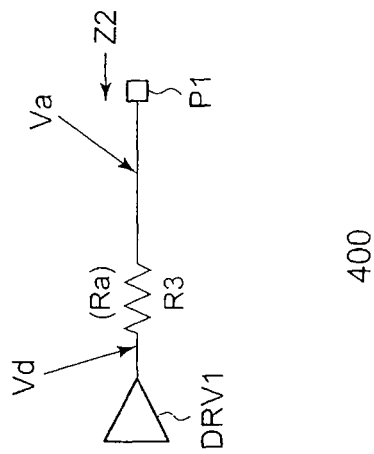

FIGS. 4A and 4B are circuit diagrams obtained by excerpting only the circuit components that relate to the impedance from, respectively, the driver/comparator circuit 400 shown in FIG. 1 and the driver/comparator circuit 100 shown in FIG. 3. From Thevenin's theorem, in order for these two circuits to be equivalent, the following first requirement and second requirement must be satisfied.

[First Requirement]

The first requirement is that the internal impedance Z1 of the driver/comparator circuit 100 shown in FIG. 3 measured via the input/output terminal P1 thereof be equal to the internal impedance Z2 of the driver/comparator circuit 400 shown in FIG. 1 measured via the input/output terminal P1 thereof.

[Second Requirement]

The second requirement is that the voltage level of the signal Va' output from the input/output terminal P1 of the driver/comparator circuit 100 shown in FIG. 3 be equal to the voltage level of the signal Va output from the input/output terminal P1 of the driver/comparator circuit 400 shown in FIG. 1.

Expression (1) below is derived from the first requirement, and Expression (2) below is derived from the second requirement.

$$Ra = Ra'//(Rb+Rc) \quad (1)$$

$$Va' = Va = Vd \quad (2)$$

Here, the symbol "//" represents the combined resistance value of resistors connected in parallel. That is to say, "//" is an operator represented by the following Expression.

$$A//B = A \times B/(A+B)$$

Expression (3) is obtained by transforming Expression (1). Furthermore, Expression (4) is obtained with reference to FIG. 4B. Expression (2) is applied to Expression (4), thereby obtaining Expression (5).

$$Ra' = \frac{Ra(Rb+Rc)}{Rb+Rc-Ra} \quad (3)$$

$$Vd' = \frac{Vd' \cdot (Rb+Rc) + Vs \cdot Ra'}{Ra' + Rb + Rc} \quad (4)$$

$$Vd = \frac{Vd' \cdot (Rb+Rc) + Vs \cdot Ra'}{Ra' + Rb + Rc} \quad (5)$$

Expression (6) is obtained by transforming Expression (5). If an output voltage Vd' that satisfies Expression (6) is chosen for the driver amplifier DRV1, the driver/comparator circuit 100 shown in FIG. 3 is equivalent to the driver/comparator circuit 400 shown in FIG. 1.

$$Vd' = Vd \cdot \frac{(Ra' + Rb + Rc)}{Rb + Rc} - Vs \cdot \frac{Ra'}{Rb + Rc} \quad (6)$$

Figure 5:
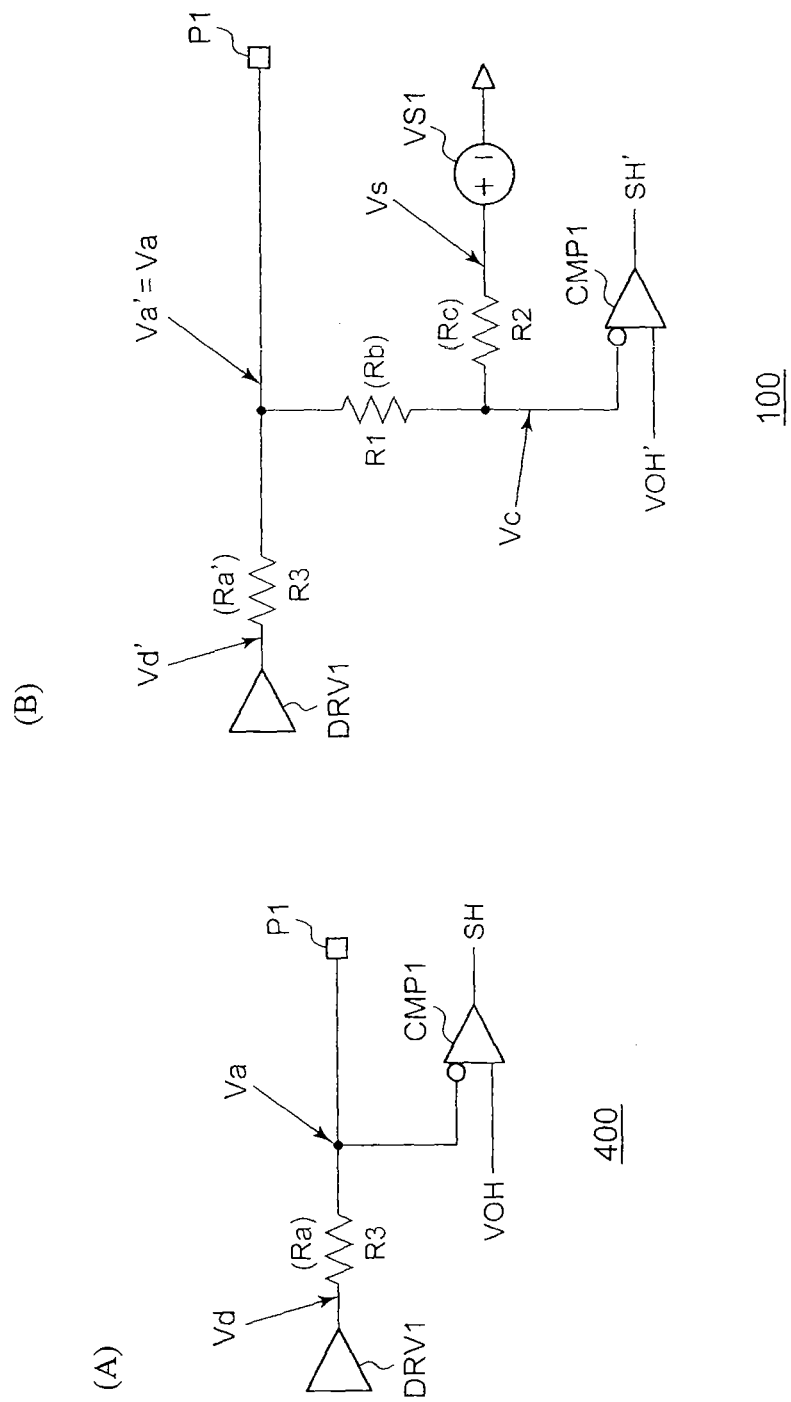
FIGS. 5A and 5B are circuit diagrams showing the driver/comparator circuit shown in FIG. 1 and the driver/comparator circuit shown in FIG. 3.

Next, description will be made regarding the threshold voltage VOH' set for the level comparator CMP1. FIGS. 5A and 5B are circuit diagrams obtained by excerpting only the circuit components that relate to the voltage comparison performed by, respectively, the driver/comparator circuit 400 shown in FIG. 1 and the driver/comparator circuit 100 shown in FIG. 3.

The Expression (7) is obtained with reference to FIG. 5B.

$$Vc = \frac{Vs \cdot Rb + Va \cdot Rc}{Rb + Rc} \quad (7)$$

Furthermore, the following Expression (8) holds true with reference to FIG. 5A.

$SH$=Lo (when $Va>VOH$)

$SH$=Hi (when $Va<VOH$)     (8)

On the other hand, with an arrangement shown in FIG. 5B, a comparison is made between Vc and VOH', and accordingly, the following Expression (9) holds true.

$SH'$=Lo (when $Vc>VOH'$)

$SH'$=Hi (when $Vc<VOH'$)     (9)

Accordingly, when the threshold voltage VOH' is determined so as to satisfy the Expression (10), such an arrangement ensures that the judgment result SH shown in FIG. 5A matches the judgment result SH' shown in FIG. 5B.

$$VOH' = \frac{Vs \cdot Rb + VOH \cdot Rc}{Rb + Rc} \quad (10)$$

It can be understood based upon the above description that, for the arrangement shown in FIG. 5A and the arrangement shown in FIG. 5B to be equivalent, Vd', Ra', and VOH' should be chosen such that Expression (6) and Expression (10) are satisfied.

Next, description will be made regarding the protection operation of the driver/comparator circuit 100 shown in FIG. 3. In the initial state, a reset signal RST is asserted, and the output signals OVH and OVL of the first flip-flop 28 and the second flip-flop 30 are each set to the low level. In this state, the protection signal NOV is set to the high level (is negated), which sets the protection switch SW1 to the on (conducting) state.

When the input voltage Vc of the level comparator CMP1 satisfies the relation VCmin<Vc<VCmax, i.e., is in the normal operation range, the signals PCH, PCL, OVH, and OVL are each set to the low level. Accordingly, the protection signal NOV remains at the high level.

When the input voltage Vc satisfies the relation Vc>VCmax, the signal PCH is set to the high level, which sets the first flip-flop 28, thereby setting OVH to the high level.

Upon receiving OVH thus switched to the high level, the protection signal NOV is set to the low level (is asserted), which sets the protection switch SW1 to the off state. After the protection signal NOV is asserted, the protection switch SW1 remains in this state until the next reset signal RST is asserted.

When the input voltage Vc satisfies the relation Vc<VCmin, the signal PCL is set to the high level, which sets the second flip-flop 30, thereby setting OVL to the high level. Upon receiving OVL thus switched to the high level, the protection signal NOV is set to the low level (is asserted), which sets the protection switch SW1 to the off state. In the same way as described above, after the protection signal NOV is asserted, the protection switch SW1 remains in this state until the next reset signal RST is asserted.

As described above, the driver/comparator circuit 100 shown in FIG. 3 is capable of suitably limiting the input voltage Vc of the level comparator CMP1.

Figure 7:
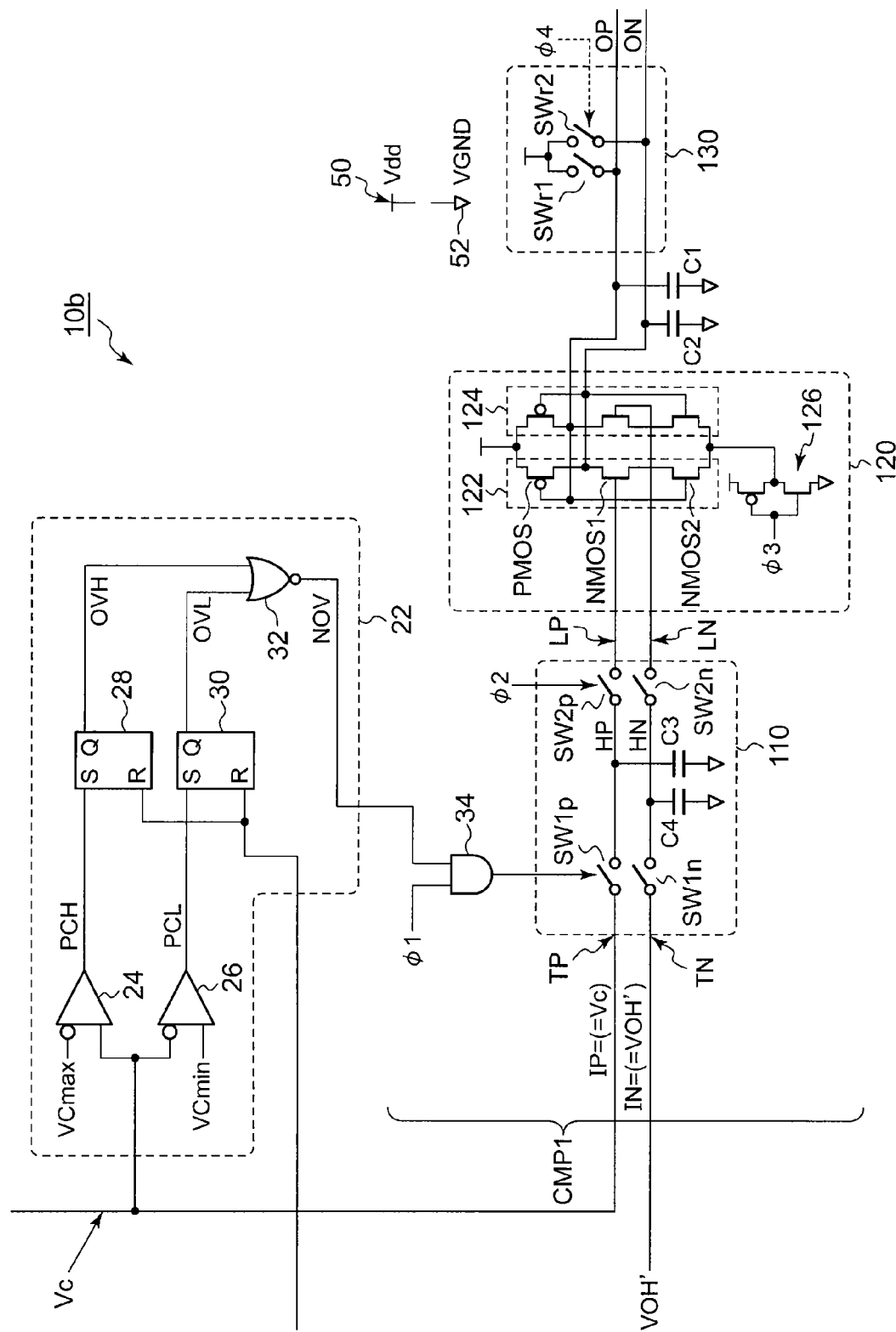
FIG. 7 is a circuit diagram which shows a comparison judgment circuit included in a driver/comparator circuit according to a second modification.

Furthermore, as can be understood from FIG. 7, the attenuator circuit 12 is capable of shifting the input voltage (attenuated voltage) Vc of the level comparator CMP1 according to the first voltage Vs. Thus, by optimizing the shift amount according to the first voltage Vs, such an arrangement is capable of operating the level comparator CMP1 in a voltage range in which the level comparator CMP1 operates with a highest sensitivity, therefore a fast judgment is achieved.

Description has been made regarding the configuration and the operation of the driver/comparator circuit 100 according to the present embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 6:
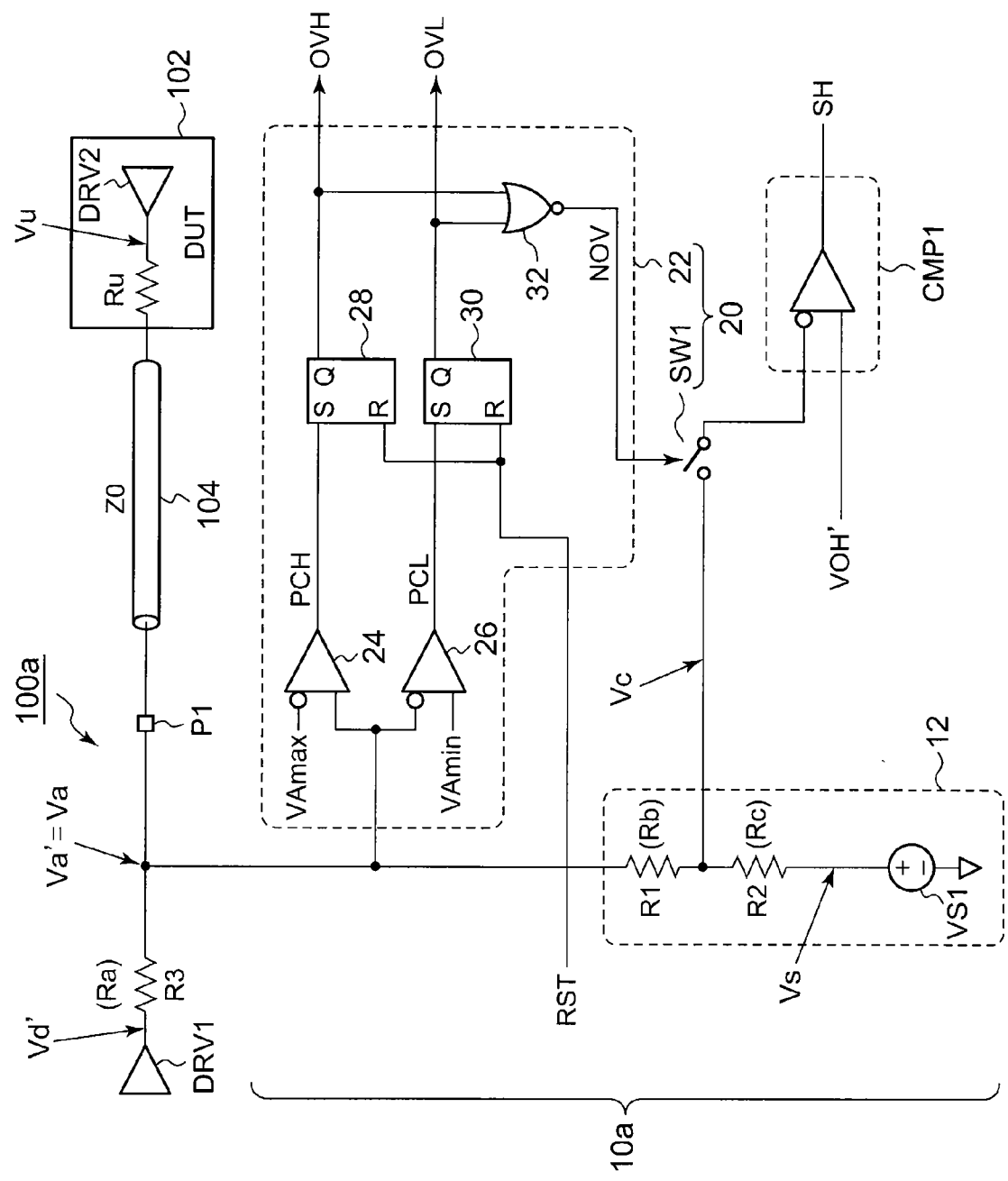
FIG. 6 is a circuit diagram which shows a configuration of a driver/comparator circuit according to a first modification.

FIG. 6 is a circuit diagram which shows a configuration of a driver/comparator circuit 100a according to a first modification. In this modification, the voltage monitoring circuit 22 of a comparison judgment circuit 10a monitors the electric potential Va' at the input/output terminal P1, instead of the input voltage (attenuated voltage) Vc of the level comparator CMP1. The other configuration is the same as that shown in FIG. 3.

The Expression (7) is transformed, thereby obtaining the Expression (6-1). The allowable input voltage range for the level comparator CMP1 is between VCmin and VCmax. Accordingly, Vc in the Expression (6-1) is replaced with VCmax and VCmin, thereby obtaining the Expression (6-2).

$$Va = \frac{Vc \cdot (Rb + Rc) - Vs \cdot Rb}{Rc} \quad (6\text{-}1)$$

$$VAmax = \frac{VCmax \cdot (Rb + Rc) - Vs \cdot Rb}{Rc} \quad (6\text{-}2)$$

$$VAmin = \frac{VCmin \cdot (Rb + Rc) - Vs \cdot Rb}{Rc}$$

By setting the maximum voltage VAmax and the minimum voltage VAmin obtained from Expression (6-2) for the voltage monitoring circuit 22 shown in FIG. 6, such an arrangement provides the same function as shown in FIG. 3.

With the driver/comparator circuit 100a shown in FIG. 6, the voltage monitoring circuit 22 is connected to a node having a low impedance (e.g., 50Ω). Thus, such an arrangement reduces the effects of the input capacitances of the upper-limit comparator 24 and the lower-limit comparator 26 on the response performance of the level comparator CMP1, as compared with an arrangement shown in FIG. 3.

[Second Modification]

FIG. 7 is a circuit diagram which shows a comparison judgment circuit 10b included in a driver/comparator circuit according to a second embodiment. In this modification, a dynamic comparator is employed as the level comparator CMP1.

The level comparator CMP1 judges, and latches, the amplitude level of the input voltage Vc at a timing set according to a control signal ($\phi 3$).

The level comparator CMP1 includes an input hold unit 110, a comparison amplifier unit 120, a reset unit 130, and a first capacitor C1 through a fourth capacitor C4.

The input voltage Vc is input to the positive-side input terminal TP, and the threshold voltage VOH' is input to the negative-side input terminal TN.

The power supply voltage Vdd is supplied as a first fixed voltage to a power supply terminal (first fixed voltage terminal) 50. The ground voltage VGND is supplied as a second fixed voltage to a ground terminal (second fixed voltage terminal) 52.

A positive-side differential signal IP (signal HP held by the input hold unit 110) propagates through a positive-side line LP. A negative-side differential signal IN (signal HN held by the input hold unit 110) propagates through a negative-side line LN.

The comparison amplifier unit 120 includes a first inverter 122, a second inverter 124, and an activating switch 126. The comparison amplifier unit 120 has a configuration which is referred to as a "dynamic comparator", a "sense latch", or the like.

The input terminal of the first inverter 122 is connected to the positive-side output line OP, and the output terminal thereof is connected to the negative-side output line ON. The first inverter 122 includes transistors PMOS, NOMS1, and NMOS2. The first inverter 122 inverts and amplifies the signal input to the gate of the transistor NMOS1, and outputs the signal thus inverted and amplified via the drain of the transistor NMOS1 (drain of the PMOS). The gates of the transistors PMOS and NMOS2 are connected so as to form a common gate electrode, which is connected to the output terminal of the second inverter 124.

The second inverter 124 has the same configuration as that of the first inverter 122. The first inverter 122 and the second inverter 124 are cross-coupled.

Specifically, the input terminal of the second inverter 124 is connected to the negative-side output line ON, and the output terminal thereof is connected to the positive-side output line OP. One of the power supply terminals of the second inverter 124 (the PMOS source terminal) is connected to a power supply terminal (first fixed voltage terminal) 50, and the other power supply terminal thereof (the NMOS2 source terminal) is connected to the power supply terminal of the first inverter 122 (the NMOS2 source terminal) so as to form a common power supply electrode.

It should be noted that each of the inverters 122 and 124 may be configured as a CMOS inverter formed of a NMOS transistor and a PMOS transistor connected in series.

The activating switch 126 is arranged such that a power supply voltage (first fixed voltage) Vdd or the ground voltage (second fixed voltage) VGND is applied to the common power supply terminal formed by connecting the other power supply terminals (the NMOS2 source terminals) of the first inverter 122 and the second inverter 124. A third control signal $\phi 3$ is input to the input terminal of the activating switch 126.

When the third control signal $\phi 3$ is negated (switched to the low level), the output voltage of the activating switch 126 is set to the first fixed voltage (power supply voltage Vdd), which inactivates the first inverter 122 and the second inverter 124.

When the third control signal $\phi 3$ is asserted (switched to the high level), the output voltage of the activating switch 126 is set to the second fixed voltage (ground voltage VGND), which activates the first inverter 122 and the second inverter 124.

The first capacitor C1 and the second capacitor C2 are connected to the positive-side output line OP and the negative-side output line ON, respectively. The first capacitor C1 and the second capacitor C2 may each be explicitly formed by provision of a MIM (Metal-Insulator-Metal) capacitance. Also, a parasitic capacitance (gate capacitance of the transistor or wiring capacitance) may be used as long as its capacitance value is appropriate. FIG. 7 shows an arrangement in which the first capacitor C1 and the second capacitor C2 are provided between the positive-side output line OP and the ground, and between the negative-side output line ON and the ground, respectively. Also, instead of such an arrangement, the positive-side output line OP and the negative-side output line ON may be coupled via a single capacitor.

The input hold unit 110 is arranged as an upstream component of the comparison amplifier unit 120. The input hold unit 110 has a function for electrically disconnecting a node that connects the input terminal of the comparison amplifier unit 120 and the positive-side input terminal TP and a node that connects the input terminal of the comparison amplifier unit 120 and the negative-side input terminal TN. The input hold unit 110 holds a differential signal IP/IN at a timing according to an instruction defined by the first control signal $\phi 1$. Furthermore, the input hold unit 110 outputs the differential signal HN/HP thus held to the comparison amplifier unit 120, which is arranged as a downstream component, at a timing according to an instruction defined by the second control signal $\phi 2$.

The input hold unit 110 includes a first positive-side switch SW1p, a second positive-side switch SW2p, a first negative-side switch SW1n, a second negative-side switch SW2n, a third capacitor C3, and a fourth capacitor C4.

The first positive-switch SW1p and the second positive-side switch SW2p are arranged in series between the positive-side input terminal TP and the positive-side line LP. A path that connects the first positive-side switch SW1p and the second positive-side switch SW2p is coupled to the ground via the third capacitor C3. When the first control signal $\phi 1$ is asserted (switched to the high level), the first positive-side switch SW1p is switched on, and when the second control signal $\phi 2$ is asserted (switched to the high level), the second positive-side switch SW2p is switched on. In a state in which the first positive-side switch SW1p is on, and the second positive-side switch SW2p is off, the electric potential at the third capacitor C3 (positive-side hold signal HP) is determined according to the positive-side differential signal IP. When the control signal $\phi 1$ is negated (switched to the low level) at a certain timing, the first positive-side switch SW1p is turned off, and the third capacitor C3 holds the positive-side differential signal IP at this timing. When the second control signal $\phi 2$ is asserted so as to turn on the second positive-side switch SW2p, the positive-side hold signal HP thus held is supplied to the positive-side line LP.

The first negative switch SW1n, the second negative-side switch SW2n, and the fourth capacitor C4 are connected in the same way. Such an arrangement holds the negative-side differential signal IN.

The third capacitor C3 and the fourth capacitor C4 may each be configured as a MIN capacitance or a parasitic capacitance, in the same way as the first capacitor C1 and the second capacitor C2. Also, instead of providing the third capacitor C3 and the fourth capacitor C4, the line on which the positive-side hold signal HP occurs and the line on which the negative-side hold signal HN occurs may be coupled via a single capacitor.

The reset unit 130 is provided in order to initialize the positive-side output signal OP and the negative-side output signal ON to the first fixed voltage (power supply voltage Vdd). Specifically, the reset unit 130 includes a first reset switch SWr1 and a second reset switch SWr2. The first reset switch SWr1 is provided between the positive-side output line OP and the power supply terminal 50 (first fixed voltage terminal). The second reset switch SWr2 is provided between the negative-side output line ON and the power supply terminal 50. When a fourth control signal φ4 is asserted (switched to the high level), the first reset switch SWr1 and the second reset switch SWr2 are each switched on, and when the fourth control signal φ4 is negated (switched to the low level), the first reset switch SWr1 and the second reset switch SWr2 are each switched off. When the first reset switch SWr1 and the second reset switch SWr2 are turned on, the electric potentials of the positive-side output signal OP and the negative-side output signal ON are promptly reset to the first fixed voltage (power supply voltage Vdd).

It should be noted that the positive-side output signal OP and the negative-side output signal ON are weakly pulled up by the power supply voltage Vdd due to a transistor which is a component of the comparison amplifier unit 120, even when the first reset switch SWr1 and the second reset switch SWr2 are not on. Thus, in a case in which the level comparator CMP1 is operated at a slow speed, the reset unit 130 may be eliminated.

The AND gate 34 generates the logical AND of the first control signal φ1 and the protection signal NOV. The first switches SW1p and SW1n are controlled according to the output signal of the AND gate 34. The first switches SW1p and SW1n correspond to the protection switch SW1 shown in FIG. 3.

With such an arrangement as that with the comparison judgment circuit 10b shown in FIG. 7, which employs a dynamic comparator having the switches SW1p and SW1n as an input stage, these switches SW1p and SW1n are controlled according to the protection signal NOV, thereby protecting the level comparator CMP1.

The level comparator CMP1 shown in FIG. 7 may have a configuration in which the power supply voltage and the ground voltage are reversed, which is effective as an embodiment.

[Third Modification]

Figure 8:
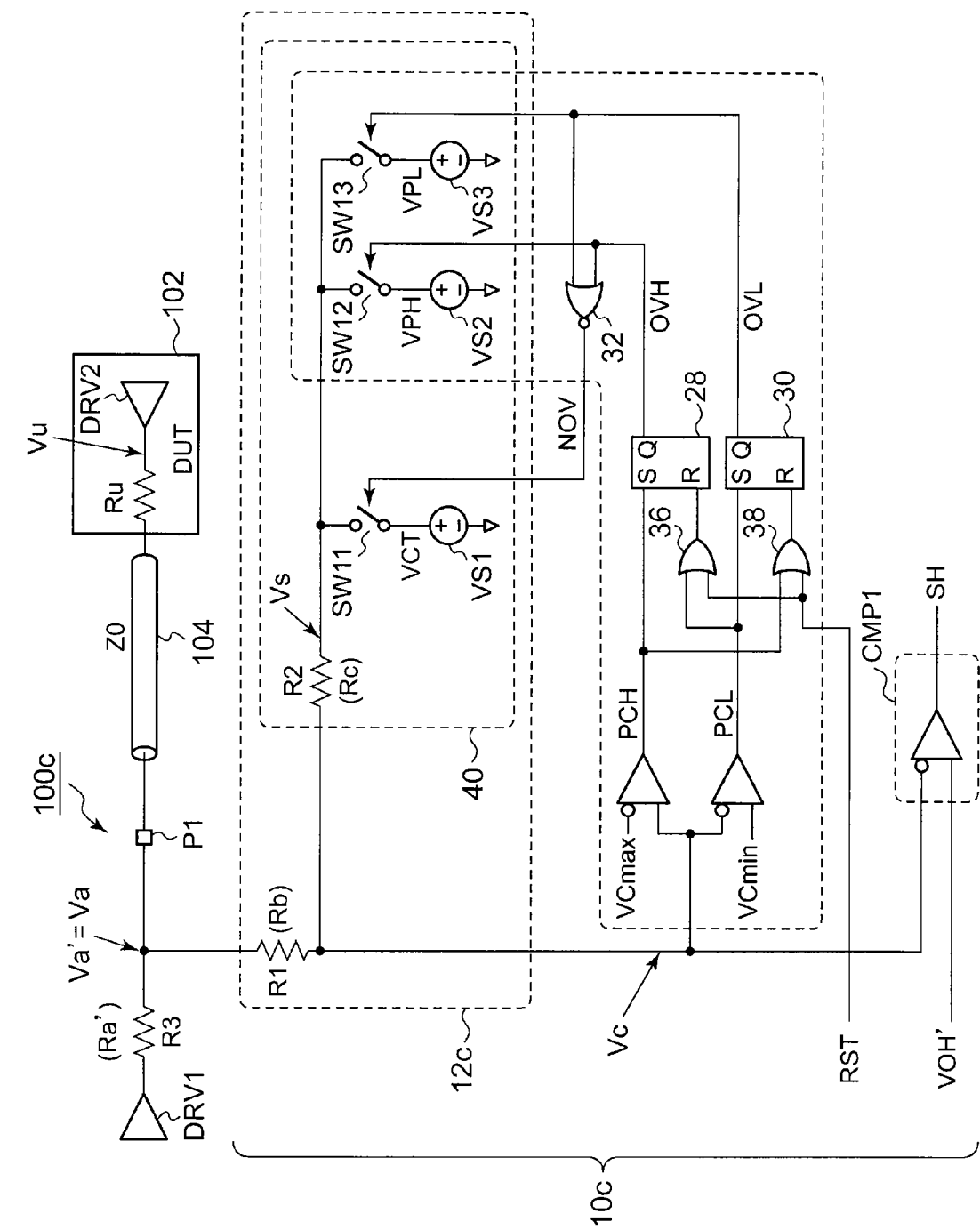
FIG. 8 is a circuit diagram which shows a configuration of a driver/comparator circuit according to a third modification.

FIG. 8 is a circuit diagram which shows a configuration of a driver/comparator circuit 100c according to a third embodiment.

The comparison judgment circuit 10 shown in FIG. 3 protects the level comparator CMP1 by cutting off the input voltage Vc of the level comparator CMP1 in the overvoltage state. In contrast, the comparison judgment circuit 10c according to the third modification protects the level comparator CMP1 by level-shifting the input voltage Vc in the overvoltage state.

An attenuator circuit 12c shown in FIG. 8 further includes a second voltage source VS2, a third voltage source VS3, and a first switch SW11 to a third switch SW13, in addition to the components of the attenuator circuit 12 shown in FIG. 3. The first voltage source VS1 to the third voltage source VS3 generate voltages VCT, VPH, and VPL, respectively. These voltages satisfy the following relation expression.

$$VPH<VCT<VPL$$

One switch selected from the first switch SW11 to the third switch SW13 is turned on according to the monitoring result obtained by a voltage monitoring circuit 22c.

A block including the voltage sources VS1 to VS3 and the switches SW11 to SW13 can be regarded as a variable voltage source 40. Also, any arrangement may be made which is capable of switching the voltage to be applied to the second terminal of the second resistor R2.

The voltage monitoring circuit 22c further includes OR gates 36 and 38, in addition to the components of the voltage monitoring circuit 22 shown in FIG. 3. When PCL is asserted, the first flip-flop 28 is reset. When PCH is asserted, the second flip-flop 30 is reset.

In the normal state, the first switch SW11 is on.

Where Vc is greater than VCmax, PCH is asserted, which turns on the second switch SW12, and turns off the first switch SW11. As a result, Vs is set to VPH. Accordingly, the input voltage Vc of the level comparator CMP1 is shifted to the low-voltage side according to Expression (7). The value of VPH is determined such that the input voltage Vc' thus shifted satisfies the relation Vc'<VCmax.

Where Vc is less than VCmin, PCL is asserted, which turns on the third switch SW13, and turns off the first switch SW11. As a result, Vs is set to VPL, and the input voltage Vc of the level comparator CMP1 is shifted to the high-voltage side according to Expression (7). The value of VPL is determined such that the input voltage Vc' thus shifted satisfies the relation Vc'>VCmin.

Figure 9:
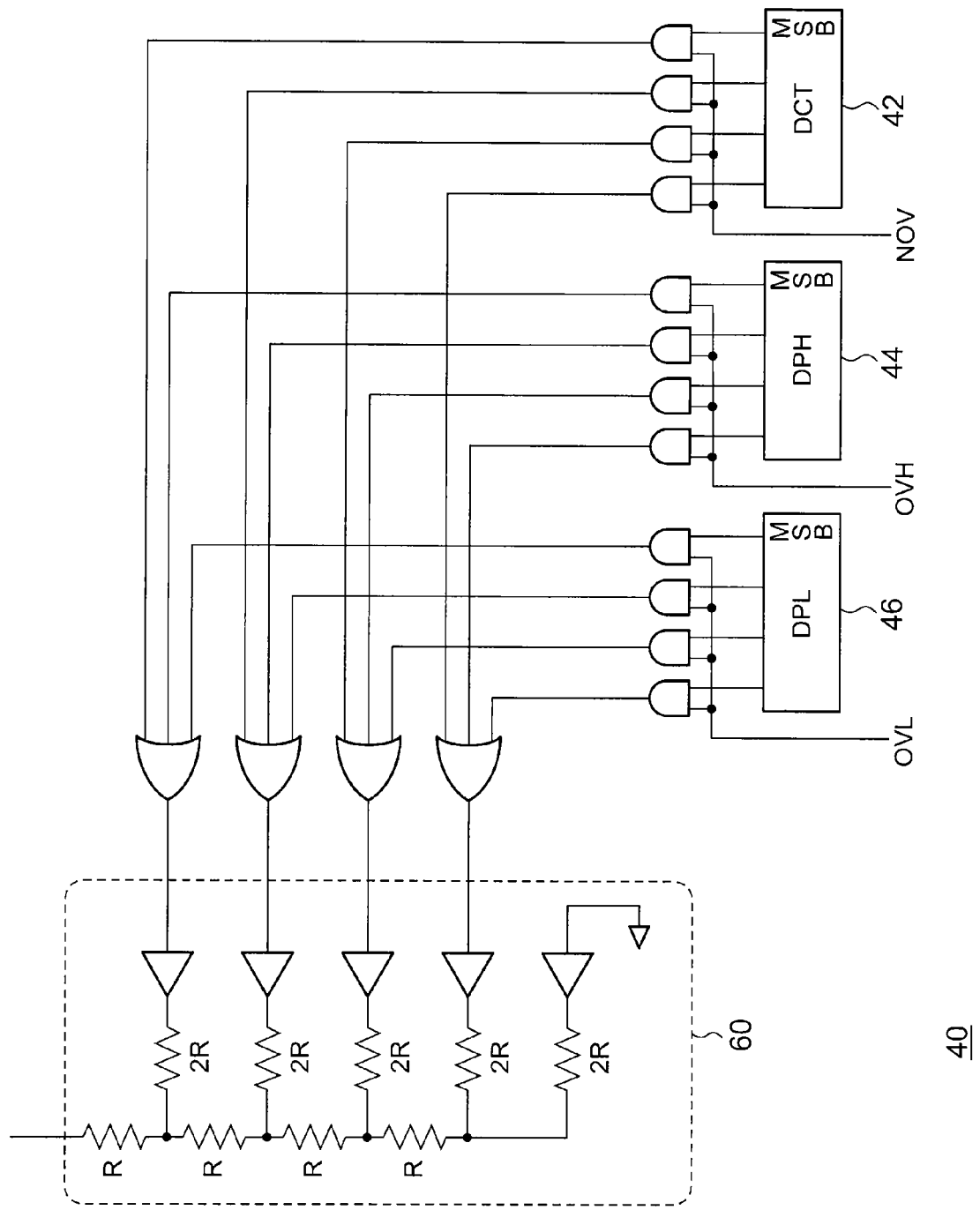
FIG. 9 is a circuit diagram which shows another example configuration of a variable voltage source shown in FIG. 8.

FIG. 9 is a circuit diagram which shows another configuration of the variable voltage source 40 shown in FIG. 8. The registers (latches) 42, 44, and 46 hold L-bit (L is an integer) digital data DCT, DPH, and DPL that correspond to the voltages VCT, VPH, and VPL, respectively.

The signals NOV, OVH, and OVL are asserted in a complementary manner. Thus, one of the control data DCT, DPH, and DPL is input to an R-2R termination circuit 60.

The R-2R termination circuit 60 includes an (L+1)-stage R-2R network and (L+1) buffers each of which is arranged to apply voltage to one terminal of the resistor R of the corresponding stage. The higher order L bits of the digital data are assigned to the respective buffers in order of how close they are to the output terminal. A fixed electric potential (e.g., ground potential) is input to the buffer farthest from the output terminal.

Where 2R=Rc, the variable voltage source 40 can be regarded as a voltage source having an output impedance Rc, which is equivalent to the variable voltage source 40 shown in FIG. 8.

With the variable voltage source 40 shown in FIG. 9, the voltages VCT, VPH, and VPL are suitably controlled according to the bit values of the digital data DCT, DPH, and DPL.

[Fourth Modification]

Figure 10:
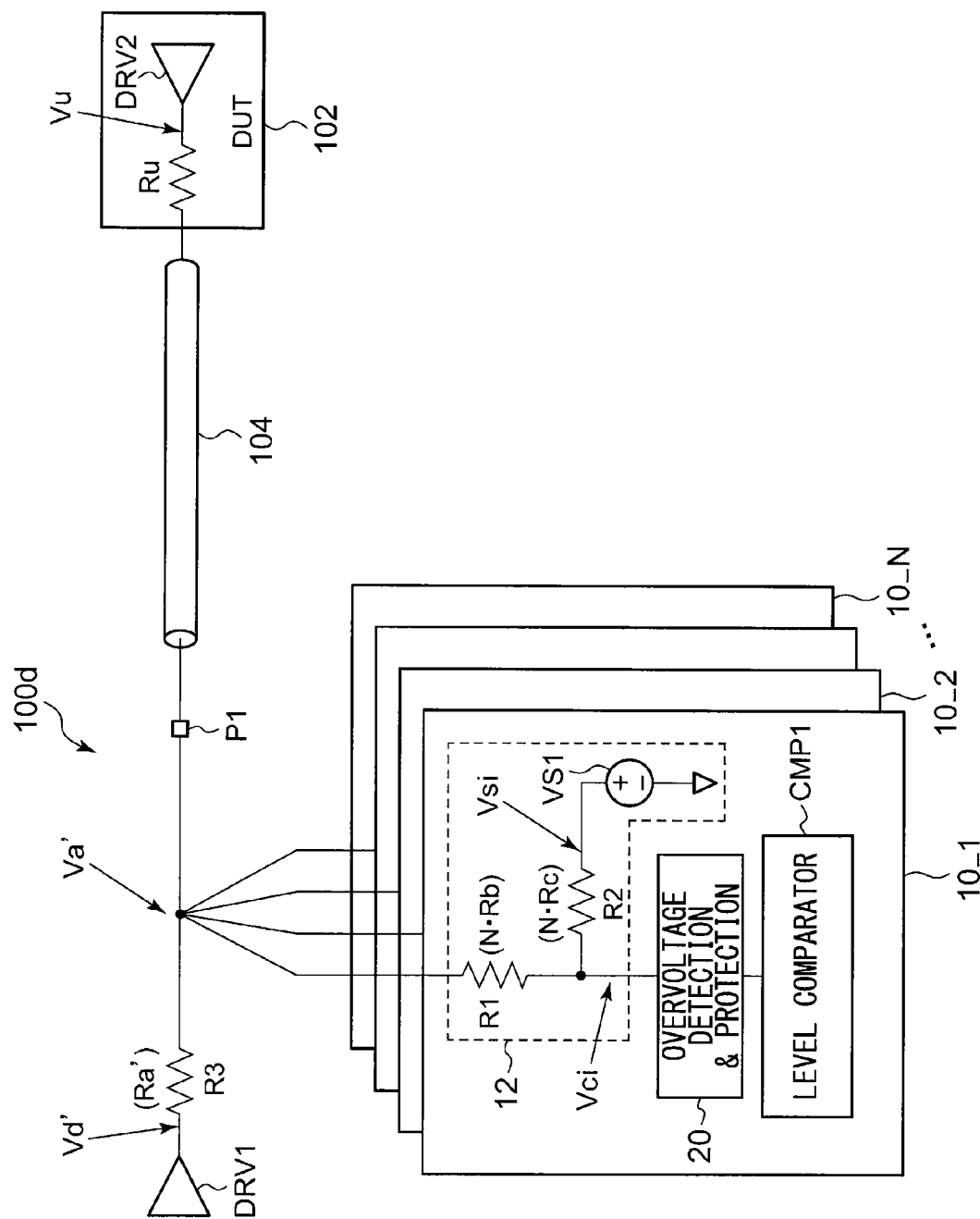
FIG. 10 is a block diagram which shows a configuration of a driver/comparator circuit according to a fourth modification.

FIG. 10 is a block diagram which shows a configuration of a driver/comparator circuit 100d according to a fourth modification. In FIG. 10, the input/output terminal P1 is connected to N (N is an integer of 2 or more) comparison judgment circuits 10_1 to 10_N in parallel. In each comparison judgment circuit 10, the resistance value of the first resistor R1 is preferably set to N·Rb, and the resistance value of the second resistor R2 is preferably set to N·Rc. In this case, the aforementioned Expression (3) can be applied without change.

With the i-th (1≤i≤N) comparison judgment circuit $10\_i$ in the driver/comparator circuit $100d$ shown in FIG. 10, the aforementioned Expressions (6), (10), and (6-2) should be replaced with the following Expressions (6'), (10'), and (6-2').

$$Vd' = Vd \cdot \frac{(Ra' + Rb + Rc) - \frac{Ra'}{N} \cdot \sum_{i=1}^{N} Vsi}{Rb + Rc} \quad (6')$$

$$VOHi' = \frac{Vsi \cdot Rb + VOHi \cdot Rc}{Rb + Rc} \quad (10')$$

$$\left. \begin{array}{l} VAi\max = \frac{VC\max \cdot (Rb + Rc) - Vsi \cdot Rb}{Rc} \\ VAi\min = \frac{VC\min \cdot (Rb + Rc) - Vsi \cdot Rb}{Rc} \end{array} \right\} \quad (6\text{-}2')$$

With the driver/comparator circuit $100d$ shown in FIG. 10, the amplitude of the signal output from the second device 102 can be compared with multiple different threshold voltages.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A comparison judgment circuit configured to judge the level of a signal received from a communication partner device via a transmission line, comprising:
    an input/output terminal connected to the transmission line;
    an attenuator circuit configured to attenuate the voltage at the input/output terminal so as to generate an attenuated voltage; and
    a level comparator configured to compare the attenuated voltage with a predetermined threshold voltage, and to generate a level judgment signal that corresponds to the comparison result;
    wherein the attenuator circuit comprises:
        a first resistor having a first terminal and a second terminal, arranged such that the first terminal thereof is connected to the input/output terminal; and
        a second resistor having a first terminal and a second terminal, arranged such that the first terminal of the second resistor is connected to the second terminal of the first resistor, and such that a first voltage is applied to the second terminal of the second resistor, wherein the voltage that occurs at a node that connects the first and second resistors is output as the attenuated voltage; and
    wherein the comparison judgment circuit further comprises a protection circuit configured to monitor the attenuated voltage at the node that connects the first and second resistors, and to forcibly cut off or change the attenuated voltage input to the level comparator when the voltage to be monitored deviates from a predetermined voltage range.

2. A comparison judgment circuit according to claim 1, wherein the protection circuit comprises:
    a voltage monitoring circuit configured to generate a protection signal which is asserted when the attenuated voltage deviates from a predetermined voltage range; and
    a protection switch provided on a path from the attenuator circuit to the level comparator, and configured to switch to a conducting state when the protection signal is negated, and to switch to a cutoff state when the protection signal is asserted.

3. A comparison judgment circuit according to claim 2, wherein the voltage monitoring circuit is configured to receive a reset signal, and to negate the protection signal when the reset signal is asserted.

4. A comparison judgment circuit according to claim 1, wherein the protection circuit comprises:
    a voltage monitoring circuit configured to generate a protection signal which is asserted when the voltage at the input/output terminal deviates from a predetermined voltage range; and
    a protection switch provided on a path from the attenuator circuit to the level comparator, and configured to switch to a conducting state when the protection signal is negated, and to switch to a cutoff state when the protection signal is asserted.

5. A comparison judgment circuit according to claim 4, wherein the voltage monitoring circuit is configured to receive a reset signal, and to negate the protection signal when the reset signal is asserted.

6. A comparison judgment circuit according to claim 1, further comprising:
    a driver configured to generate a signal to be transmitted to the communication partner device via the transmission line; and
    a third resistor provided between the output terminal of the driver and the input/output terminal.

7. A test apparatus configured to perform bidirectional signal transmission with a device under test via a transmission line, and to test the device under test, comprising a comparison judgment circuit according to claim 6, configured to function as a communication partner with the device under test.

8. A comparison judgment circuit configured to judge the level of a signal received from a communication partner device via a transmission line, comprising:
    an input/output terminal connected to the transmission line;
    an attenuator circuit configured to attenuate the voltage at the input/output terminal so as to generate an attenuated voltage; and
    a level comparator configured to compare the attenuated voltage with a predetermined threshold voltage and to generate a level judgment signal that corresponds to the comparison result;
    wherein the attenuator circuit comprises:
        a first resistor having a first terminal and a second terminal, arranged such that the first terminal thereof is connected to the input/output terminal; and
        a second resistor having a first terminal and a second terminal, arranged such that the first terminal of the second resistor is connected to the second terminal of the first resistor, and such that a first voltage is applied to the second terminal of the second resistor, wherein the voltage that occurs at a node that connects the first and second resistors is output as the attenuated voltage; and wherein the comparison judgment circuit further comprises a voltage monitoring circuit configured to monitor the attenuated voltage at the node that connects the first and second resistors, and to generate a protection signal which is asserted when the voltage to be monitored deviates from a predetermined voltage range, wherein the level comparator is configured as a dynamic comparator including, as an input unit, an input switch configured to hold the attenuated voltage and the threshold voltage, and wherein the input switch is configured to switch to a conducting state when the protection signal is negated, and to switch to a cutoff state when the protection signal is asserted.

9. A comparison judgment circuit configured to judge the level of a signal received from a communication partner device via a transmission line, comprising:

an input/output terminal connected to the transmission line;

an attenuator circuit configured to attenuate the voltage at the input/output terminal so as to generate an attenuated voltage; and a level comparator configured to compare the attenuated voltage with a predetermined threshold voltage, and to generate a level judgment signal that corresponds to the comparison result;

wherein the attenuator circuit comprises:

a first resistor having a first terminal and a second terminal, arranged such that the first terminal thereof is connected to the input/output terminal; and a second resistor having a first terminal and a second terminal, arranged such that the first terminal of the second resistor is connected to the second terminal of the first resistor, and such that a first voltage is applied to the second terminal of the second resistor, wherein the voltage that occurs at a node that connects the first and second resistors is output as the attenuated voltage; and wherein the comparison judgment circuit further comprises a voltage monitoring circuit configured to monitor the voltage at the input/output terminal or the attenuated voltage, and to generate a protection signal which indicates a voltage range to which the voltage to be monitored belongs; and a voltage source configured to apply a first voltage to the second terminal of the second resistor, wherein the voltage source is configured to change the value of the first voltage according to the protection signal.

* * * * *